United States Patent
Koyama et al.

(10) Patent No.: US 10,734,291 B2
(45) Date of Patent: Aug. 4, 2020

(54) ABNORMALITY DETECTION APPARATUS

(71) Applicant: Tokyo Electron Limited, Tokyo (JP)

(72) Inventors: Noriaki Koyama, Iwate (JP); Kazushi Shoji, Sapporo (JP); Motokatsu Miyazaki, Sapporo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 271 days.

(21) Appl. No.: 15/800,306

(22) Filed: Nov. 1, 2017

(65) Prior Publication Data

US 2018/0138096 A1   May 17, 2018

(30) Foreign Application Priority Data

Nov. 11, 2016 (JP) ................. 2016-220588

(51) Int. Cl.
| | |
|---|---|
| H01L 21/66 | (2006.01) |
| G01R 31/26 | (2020.01) |
| G06F 17/18 | (2006.01) |
| G06F 19/00 | (2018.01) |

(52) U.S. Cl.
CPC .............. *H01L 22/10* (2013.01); *G01R 31/26* (2013.01); *G06F 17/18* (2013.01); *G06F 19/00* (2013.01)

(58) Field of Classification Search
CPC ....................................................... H01L 22/10
USPC ...................................................... 702/182
See application file for complete search history.

(56) References Cited

U.S. PATENT DOCUMENTS

| | | | | |
|---|---|---|---|---|
| 5,631,825 A | * | 5/1997 | van Weele | G05B 19/0426 700/83 |
| 6,521,080 B2 | * | 2/2003 | Balasubramhanya | G01N 21/274 118/723 E |
| 2009/0009741 A1 | * | 1/2009 | Okita | G03F 7/70516 355/53 |
| 2012/0005542 A1 | * | 1/2012 | Petersen | G06F 11/0709 714/48 |

FOREIGN PATENT DOCUMENTS

| | | |
|---|---|---|
| JP | H02-263211 A | 10/1990 |
| JP | 2015-037086 A | 2/2015 |
| WO | 2014/115643 A | 7/2014 |

* cited by examiner

*Primary Examiner* — Ricky Ngon
(74) *Attorney, Agent, or Firm* — Abelman, Frayne & Schwab (57) ABSTRACT

Disclosed is an abnormality detection apparatus including: a collection unit that collects state information indicating a state of each part of a semiconductor manufacturing apparatus in a predetermined cycle; a storage unit that stores the state information collected by the collection unit as a log for each predetermined unit; an arithmetic unit that generates a monitoring band for monitoring the state of each part of the semiconductor manufacturing apparatus, based on the log; and a determination unit that determines whether the state of each part of the semiconductor manufacturing apparatus is abnormal, based on the state information and the monitoring band.

18 Claims, 5 Drawing Sheets

Monitoring with the band and relearning for adjusting data drift automatically

*FIG. 7*

ABNORMALITY DETECTION APPARATUS

CROSS-REFERENCE TO RELATED APPLICATIONS

This application is based on and claims priority from Japanese Patent Application No. 2016-220588 filed on Nov. 11, 2016 with the Japan Patent Office, the disclosure of which is incorporated herein in its entirety by reference.

TECHNICAL FIELD

The present disclosure relates to an abnormality detection apparatus.

BACKGROUND

When a semiconductor manufacturing apparatus is operated for a long time, the reproducibility of the process decreases due to various factors such as, for example, wear and deterioration of components, change in the internal environment of the chamber due to the accumulation of by-products generated from the process, change in utility environment of, for example, gas and cooling water to be supplied, and sudden breakdown of components. The frequency of occurrence of the events varies depending on the operation state of the apparatus, and the occurrence of the events may be easily predicted or not.

In the case where the occurrence of the events is easily predicted, it is possible to preventively and conservatively cope with the events by performing replacement or adjustment of consumable parts by periodical maintenance. Meanwhile, in the case where the occurrence of the events is not easily predicted, it is difficult to cope with the events by the periodical maintenance.

Therefore, in the related art, long-term trends are monitored by converting output values output by various sensors during the performance of the process into representative values (e.g., an average value, a maximum value, and a minimum value) in a predetermined period, for example, in step units included in the process, and using the representative values (see, e.g., Japanese Patent Laid-Open Publication No. 2015-037086).

SUMMARY

According to an aspect of the present disclosure, there is provided an abnormality detection apparatus including: a collection unit that collects state information indicating a state of each part of a semiconductor manufacturing apparatus in a predetermined cycle; a storage unit that stores the state information collected by the collection unit as a log for each predetermined unit; an arithmetic unit that generates a monitoring band for monitoring the state of each part of the semiconductor manufacturing apparatus, based on the log; and a determination unit that determines whether the state of each part of the semiconductor manufacturing apparatus is abnormal, based on the state information and the monitoring band.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

The method of the related art is to monitor the conversion of the output values output from the various sensors into representative values, and the output value is not directly monitored. Therefore, it is difficult to predict any abnormality by detecting minute changes occurring in a short period of time. Further, a user manually enters the band. Therefore, there is a problem that it takes time for the operation, and thus, it is difficult to carry out the operation.

In an aspect, the present disclosure is to provide an abnormality detection apparatus capable of detecting minute changes occurring in a short period of time and predicting the abnormality.

According to an aspect of the present disclosure, there is provided an abnormality detection apparatus including: a collection unit that collects state information indicating a state of each part of a semiconductor manufacturing apparatus in a predetermined cycle; a storage unit that stores the state information collected by the collection unit as a log for each predetermined unit; an arithmetic unit that generates a monitoring band for monitoring the state of each part of the semiconductor manufacturing apparatus, based on the log; and a determination unit that determines whether the state of each part of the semiconductor manufacturing apparatus is abnormal, based on the state information and the monitoring band.

In the above-described abnormality detection apparatus, after a process by the semiconductor manufacturing apparatus is completed, the determination unit determines whether there are more than a prescribed number of logs of a process performed according to the same recipe as a recipe used in the process by referring to the storage unit.

In the above-described abnormality detection apparatus, when the determination unit determines that there are more than the prescribed number of logs of the process performed according to the same recipe as the recipe used in the process, the monitoring band includes a monitoring band generated by being associated with the recipe using a plurality of logs stored in the storage unit.

In the above-described abnormality detection apparatus, when the process by the semiconductor manufacturing apparatus is started, the determination unit determines whether there is a monitoring band associated with the recipe used in the process by referring to the storage unit, and when there is a monitoring band associated with the recipe used in the process, the determination unit determines whether the state of each part of the semiconductor manufacturing apparatus is abnormal based on the log of the process and the monitoring band associated with the recipe used in the process.

In the above-described abnormality detection apparatus, when the determination unit determines that the state of each part of the semiconductor manufacturing apparatus is not abnormal, the arithmetic unit generates a new monitoring band based on the log of the process and the monitoring band associated with the recipe used in the process.

The above-described abnormality detection apparatus further includes a display unit that displays abnormality of the semiconductor manufacturing apparatus when the determination unit determines that the state of each part of the semiconductor manufacturing apparatus is abnormal.

In the above-described abnormality detection apparatus, the monitoring band is a waveform calculated by performing interpolation based on upper and lower limit values set in the predetermined cycle.

In the above-described abnormality detection apparatus, the predetermined unit is a recipe unit.

In the above-described abnormality detection apparatus, the predetermined unit is a step unit obtained by subdividing the recipe.

In the above-described abnormality detection apparatus, the state information is information including a temperature, a pressure, a gas flow rate, an electric power of each part of the semiconductor manufacturing apparatus.

According to the abnormality detection apparatus of the present disclosure, it is possible to detect minute changes occurring in a short period of time and predict the abnormality. In addition, since the bands are created automatically, the number of steps for creating the bands is reduced, so that the time for carrying out the operation may be reduced.

Hereinafter, an exemplary embodiment of the present disclosure will be described with reference to the drawings. In the present specification and drawings, components having substantially the same configurations will be denoted by the same symbols, and the overlapping descriptions thereof will be omitted.

(Semiconductor Manufacturing Apparatus)

Descriptions will be made on an exemplary semiconductor manufacturing apparatus of the exemplary embodiment of the present disclosure. The semiconductor manufacturing apparatus according to the exemplary embodiment of the present disclosure is a batch type film forming apparatus capable of accommodating a substrate holder holding a plurality of semiconductor wafers (hereinafter, referred to as "wafers W") at predetermined intervals in the vertical direction in a processing container and forming a film on the plurality of wafers W at the same time. The semiconductor manufacturing apparatus is not limited to the batch type apparatus, and may be, for example, a single-wafer type apparatus that performs a film forming processing on wafers W one by one.

Figure 1:
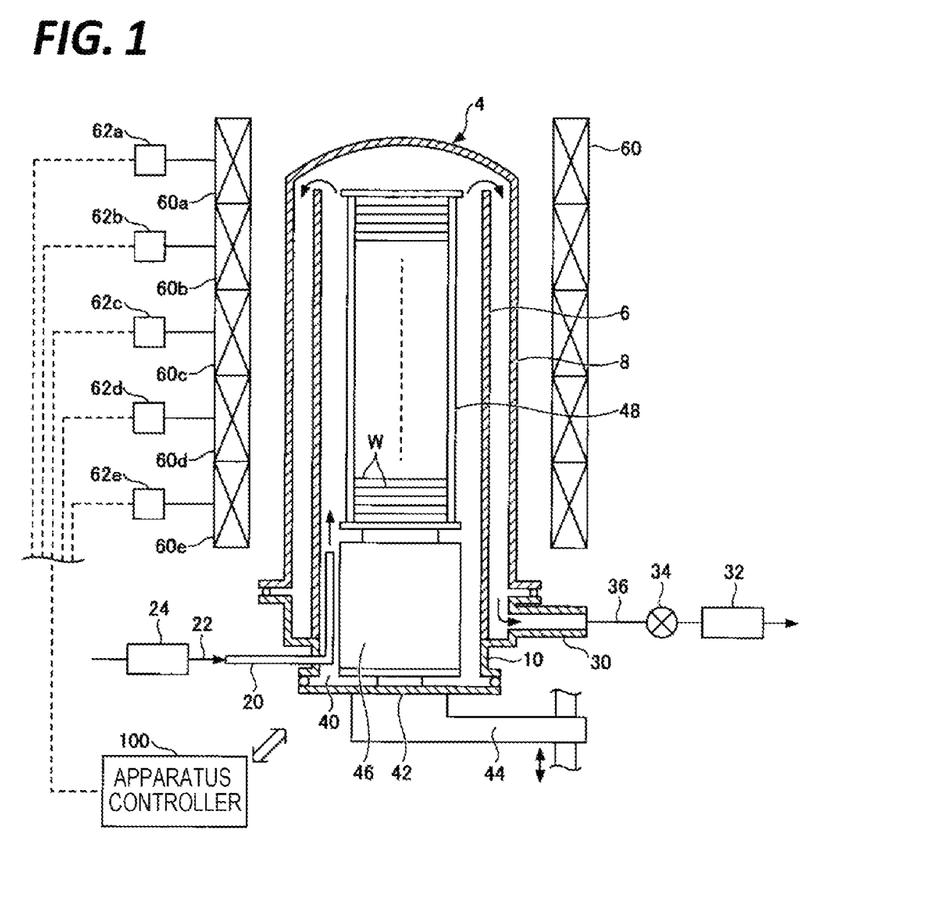
FIG. 1 is an overall configuration diagram illustrating a semiconductor manufacturing apparatus according to an exemplary embodiment of the present disclosure.

FIG. 1 is an overall configuration diagram illustrating a semiconductor manufacturing apparatus according to an exemplary embodiment of the present disclosure. As illustrated in FIG. 1, the semiconductor manufacturing apparatus includes a substantially cylindrical processing container 4 of which the longitudinal direction is a vertical direction. The processing container 4 has a dual pipe structure including an inner cylinder 6 of a cylindrical body and an outer cylinder 8 disposed coaxially with the inner cylinder 6 outside the inner cylinder 6 and having a ceiling. The inner cylinder 6 and the outer cylinder 8 are made of a heat-resistant material such as, for example, quartz.

The inner cylinder 6 and the outer cylinder 8 are held at the lower end portions thereof by a manifold 10 made of, for example, stainless steel. The manifold 10 is fixed to, for example, a base plate (not illustrated). Since the manifold 10 forms a substantially cylindrical internal space together with the inner cylinder 6 and the outer cylinder 8, it is assumed that the manifold 10 forms a part of the processing container 4. That is, the processing container 4 includes the inner cylinder 6 and the outer cylinder 8 made of a heat-resistant material (e.g., quartz), and a manifold 10 made of, for example, stainless steel. The manifold 10 is provided in the lower portion of the lateral surface of the processing container 4 to hold the inner cylinder 6 and the outer cylinder 8 from the lower side.

The manifold 10 is provided with a gas introduction portion 20 to introduce various kinds of gases (e.g., a processing gas such as, for example, a film forming gas or an additive gas used for a film forming process and a purge gas used for a purge processing) into the processing container 4. Although FIG. 1 illustrates a configuration in which one gas introduction portion 20 is provided, the present disclosure is not limited thereto. A plurality of gas introduction portions 20 may be provided depending on, for example, the kind of gas to be used. The kinds of the processing gas and the purge gas are not particularly limited, but may be appropriately selected depending on the type of the film to be formed.

The gas introduction portion 20 is connected with an introduction pipe 22 to introduce various kinds of gases into the processing container 4. The introduction pipe 22 includes, for example, a flow rate adjusting unit 24 (e.g., a mass flow controller) for adjusting the gas flow rate, a valve or a flow rate sensor (not illustrated) interposed therein.

Further, the manifold 10 is provided with a gas exhaust portion 30 to exhaust the atmosphere inside the processing container 4. The gas exhaust portion 30 is connected with an exhaust pipe 36 including a vacuum pump 32 and an opening variable valve 34 (e.g., an automatic pressure control (APC) valve), which are capable of controllably decompressing the inside of the processing container 4. The exhaust pipe 36 is provided with a pressure sensor (not illustrated) that detects the pressure inside the processing container 4.

A furnace opening 40 is formed in the lower end portion of the manifold 10, and the furnace opening 40 is provided with a disk-like lid 42 made of, for example, stainless steel. The lid 42 is provided to be elevatable by, for example, an elevating mechanism 44 that functions as a boat elevator, and is configured to hermetically seal the furnace opening 40.

A heat insulating cylinder 46 made of, for example, quartz is provided on the lid 42. A wafer boat 48 made of, for example, quartz is placed on the heat insulating cylinder 46 to hold a plurality of (e.g., about 50 to 175) wafers W in a horizontal state at predetermined intervals in multi-tiers.

The wafer boat 48 is loaded (carried in) to the inside of the processing container 4 by moving up the lid 42 using the elevating mechanism 44, and various film forming processes are performed on the wafers W held in the wafer boat 48. After various film forming processes are performed, the wafer boat 48 is unloaded (carried out) from the inside of the processing container 4 to the lower loading region by moving down the lid 42 using the elevating mechanism 44.

For example, a cylindrical heating unit 60, which is capable of controllably heating the processing container 4 to a predetermined temperature, is provided on the outer peripheral side of the processing container 4.

The heating unit 60 is divided into a plurality of zones, and heating units 60a to 60e are provided from the upper side to the lower side in the vertical direction. The heating units 60a to 60e are configured to independently control the heat generation amounts by power controllers 62a to 62e, respectively. Hereinafter, the positions where the heating units 60a, 60b, 60c, 60d, and 60e are provided may be referred to as "TOP," "TC," "Center," "C-B," and "BTM," respectively. Further, temperature sensors (not illustrated) are provided on the inner wall of the inner cylinder 6 and/or the outer wall of the outer cylinder 8 to correspond to the heating units 60a to 60e. Although FIG. 1 illustrates a configuration in which the heating unit 60 is divided into five zones, the present disclosure is not limited thereto. For example, the heating unit 60 may be divided into four or less zones, or six or more zones, from the upper side to the lower side in the vertical direction. Further, the heating unit 60 may not be divided into a plurality of zones.

The plurality of wafers W placed on the wafer boat 48 constitute one batch, and various film forming processes are performed in the unit of one batch.

Further, the semiconductor manufacturing apparatus of the exemplary embodiment of the present disclosure includes an apparatus controller 100 such as, for example, a computer to control the operation of the entire apparatus. The apparatus controller 100 may be connected to a host computer 500 by, for example, a wired or wireless communication unit.

(Apparatus Controller)

Figure 2:
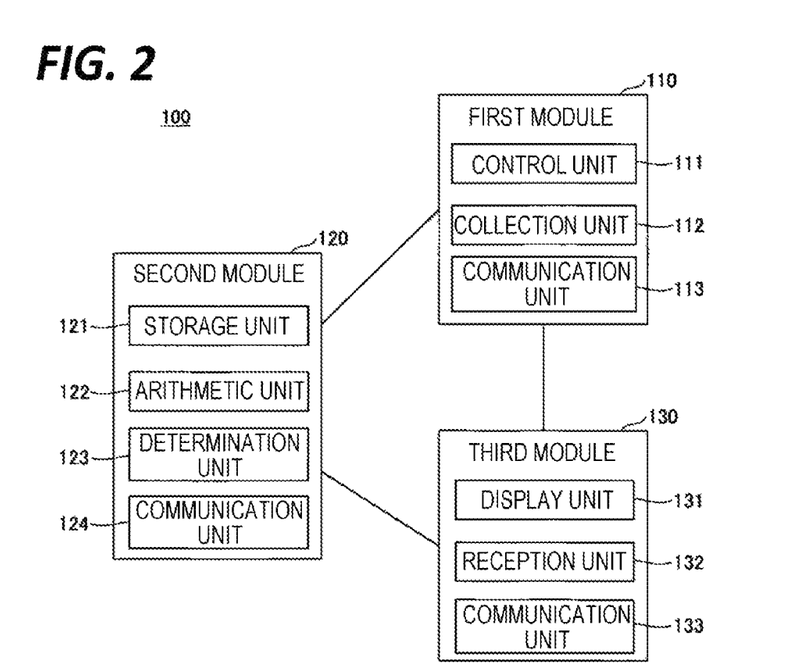
FIG. 2 is a block diagram for explaining an apparatus controller.

Next, an example of the apparatus controller 100 will be described. FIG. 2 is a block diagram for explaining the apparatus controller.

As illustrated in FIG. 2, the apparatus controller 100 includes a first module 110, a second module 120, and a third module 130. The first module 110, the second module 120, and the third module 130 are configured as a controller accommodated in the semiconductor manufacturing apparatus. This eliminates a need for, for example, an external server. Further, the first module 110, the second module 120, and the third module 130 may be capable of communicating with each other bidirectionally through a communication network such as, for example, a local area network (LAN).

The first module 110 includes a control unit 111, a collection unit 112, and a communication unit 113. The control unit 111 controls each part of the semiconductor manufacturing apparatus. The collection unit 112 collects state information indicating a state of each part of the semiconductor manufacturing apparatus at a predetermined period (e.g., every 0.1 seconds). The state information is a value detected by a sensor (e.g., a temperature sensor, a pressure sensor, or a flow sensor) which detects the state of each part of the semiconductor manufacturing apparatus, and includes, for example, a temperature, a pressure, and a gas flow rate of each part of the semiconductor manufacturing apparatus. The communication unit 113 transmits and receives information to and from, for example, the second module 120 and the third module 130. For example, the communication unit 113 transmits the state information collected by the collection unit 112 to the second module 120. The function of the first module 110 is implemented by a computer equipped with, for example, a CPU, a storage device, an input device, and a display device.

The second module 120 includes a storage unit 121, an arithmetic unit 122, a determination unit 123, and a communication unit 124. The storage unit 121 stores various kinds of data. Specifically, the storage unit 121 stores, for example, the state information collected by the collection unit 112 as a log for each process. Further, the storage unit 121 stores, for example, a monitoring band (to be described later). The arithmetic unit 122 generates a monitoring band using the log of each process stored in the storage unit 121. For example, the arithmetic unit 122 generates a monitoring band using a plurality of logs obtained by the process of the same recipe stored in the storage unit 121. The monitoring band is a waveform used when determining whether the state information collected by the collecting unit 112 is normal, and calculated by performing, for example, interpolation based on upper and lower limit values set in the predetermined cycle. An algorithm for generating the monitoring band is not particularly limited, but may be any arbitrary algorithm. The determination unit 123 determines whether there are more than a prescribed number of logs obtained by the process of the same recipe as a recipe when a predetermined process is performed, by referring to the storage unit 121. The prescribed number is a number ensuring that an initial learning (to be described later) may be performed with high precision, and may be set to, for example, 20. In addition, the determination unit 123 determines whether the state information is abnormal by using the monitoring band generated by the arithmetic unit 122, thereby determining the abnormality of the semiconductor manufacturing apparatus. The communication unit 124 transmits and receives information to and from, for example, the first module 110 and the third module 130. For example, the communication unit 124 receives the state information collected by the collection unit 112 of the first module 110. In addition, for example, the communication unit 124 transmits the abnormality determination result of the semiconductor manufacturing apparatus determined by the determination unit 123 to the third module 130. Further, the second module 120 needs to store a lot of data and also needs to perform calculation at a high speed. Therefore, the second module 120 is configured as a module independent from the first module 110 that controls each part of the semiconductor manufacturing apparatus, so as not to affect the control of the semiconductor manufacturing apparatus. The function of the second module 120 is implemented by a computer equipped with, for example, a CPU, a storage device, an input device, and a display device.

The third module 130 includes a display unit 131, a reception unit 132, and a communication unit 133. The display unit 131 displays various kinds of information related to the semiconductor manufacturing apparatus, for example, the state of the semiconductor manufacturing apparatus (e.g., whether it is in a normal state or in an abnormal state). In addition, the display unit 131 may display, for example, logs or monitoring bands stored in the storage unit 121. The reception unit 132 receives an operation by, for example, a user. The communication unit 133 transmits and receives information to and from, for example, the first module 110 and the second module 120. For example, the communication unit 133 receives the abnormality determination result of the semiconductor manufacturing apparatus determined by the determination unit 123 of the second module 120. The function of the third module 130 is implemented by a computer equipped with, for example, a CPU, a storage device, an input device, and a display device.

(Abnormality Detection Processing)

Descriptions will be made on an exemplary abnormality detection processing of the exemplary embodiment of the present disclosure. The abnormality detection processing is performed by the above-described apparatus controller 100.

Figure 3:
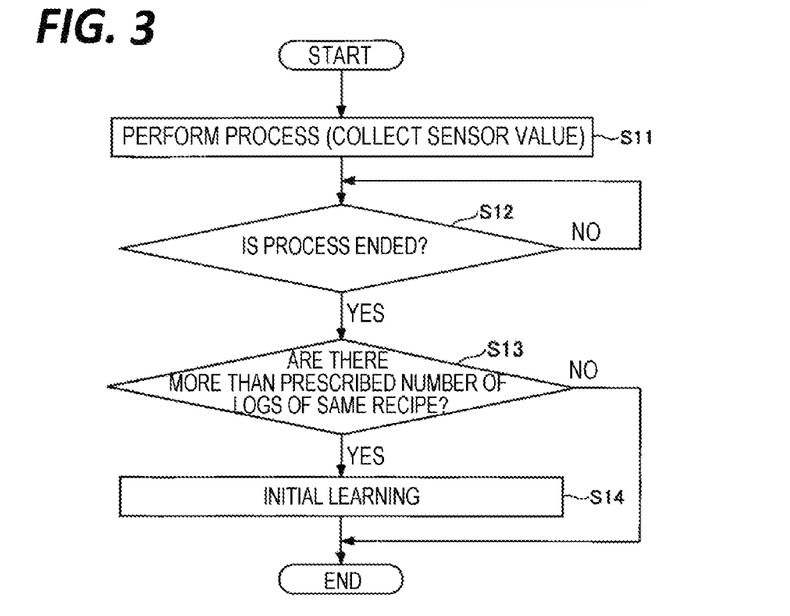
FIG. 3 is a flow chart for explaining an initial learning of an abnormality detection processing of the exemplary embodiment of the present disclosure.
Figure 4A:
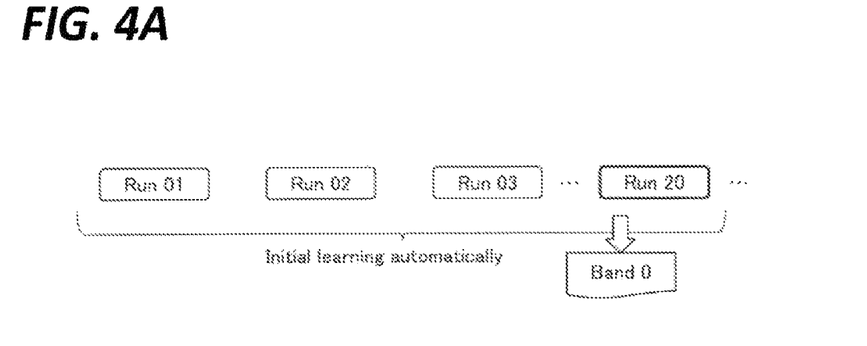
FIGS. 4A and 4B are views for explaining the initial learning.
Figure 4B:
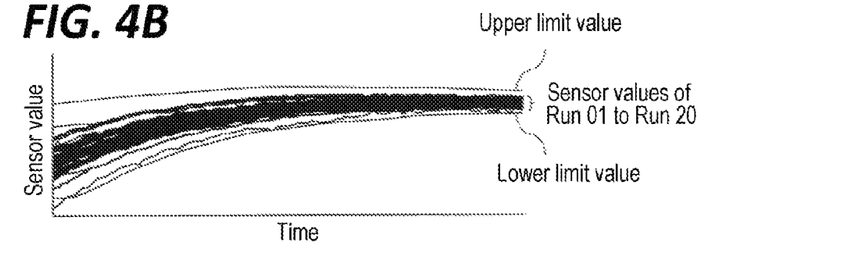

FIG. 3 is a flow chart for explaining an initial learning in the abnormality detection processing of the exemplary embodiment of the present disclosure. FIGS. 4A and 4B are views for explaining the initial learning. In the descriptions below, an exemplary case where a process using recipe A is performed as a predetermined process will be described.

As illustrated in FIG. 3, while the process using recipe A is performed in the semiconductor manufacturing apparatus, the collection unit 112 collects the state information from the various sensors of the semiconductor manufacturing apparatus at a predetermined period (e.g., every 0.1 seconds) (step S11). At this time, the storage unit 121 stores, for example, the state information collected by the collection unit 112 as a log of the process using recipe A.

When the process is completed (step S12), the determination unit 123 determines whether there are more than a prescribed number of logs of the process performed using recipe A by referring to the storage unit 121 (step S13).

In step S13, when the determination unit 123 determines that there are not more than the predetermined number of logs of the process performed using recipe A, it is determined that there is no log necessary to generate a monitoring band, and the processing is ended.

In step S13, when the determination unit 123 determines that there are more than the predetermined number of logs of the process performed using recipe A, it is determined that there is a log necessary to generate a monitoring band. Then, the arithmetic unit 122 performs an initial learning (step S14) for generating a monitoring band using a plurality of logs that are equal to or more than the prescribed number of the process performed using recipe A stored in the storage unit 121, and the processing is ended. Specifically, as illustrated in FIG. 4A, a monitoring band is generated, which has a waveform including all logs when a plurality of processes using recipe A (e.g., Run 01, Run 02, . . . Run 20) are performed (see FIG. 4B). The monitoring band is generated for each sensor and for each recipe. Therefore, the abnormality determination may be performed in consideration of a slight change in state information that occurs when the same recipe is executed.

In the semiconductor manufacturing apparatus, however, the repeated performance of the process is accompanied by various changes such as, for example, wear and deterioration of components, change in the internal environment of the chamber due to the accumulation of by-products generated from the process, change in utility environment of, for example, gas and cooling water to be supplied, and sudden breakdown of components. Such changes are tolerable as long as the changes are within a certain range that does not adversely affect the results of the process, and may be restored to the original conditions by periodic cleaning or replacement of parts. That is, when the change in state information is included within the certain range, the change is not an abnormality of the semiconductor manufacturing apparatus. Thus, using the state information that changes within the certain range, re-learning is performed every time the process is ended, so that the monitoring band is caused to follow the change within the certain range. Therefore, it is possible to ensure that no abnormality is determined when the state information changes within the certain range.

Figure 5:
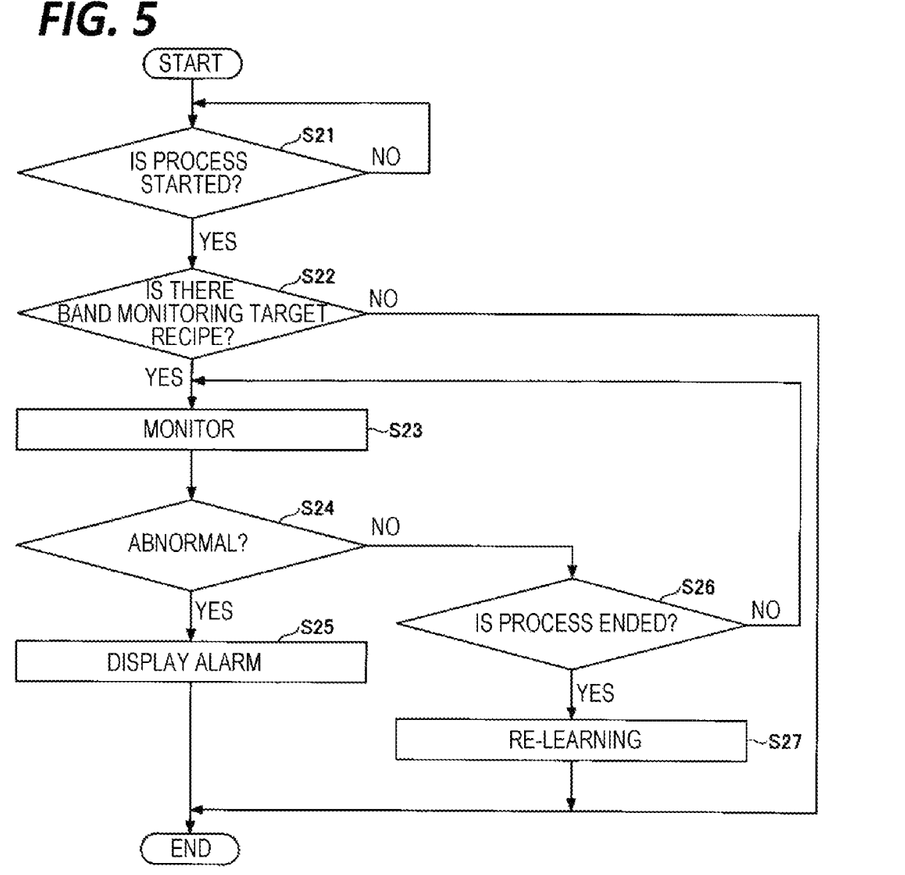
FIG. 5 is a flow chart for explaining a re-learning of the abnormality detection processing of the exemplary embodiment of the present disclosure.

FIG. 5 is a flow chart for explaining a re-learning of the abnormality detection processing of the exemplary embodiment of the present disclosure.

As illustrated in FIG. 5, when a predetermined process (e.g., the process using recipe A) is started (step S21), the determination unit 123 determines whether there is a monitoring band associated with recipe A by referring to the storage unit 121 (step S22). The determination unit 123 may start to determine whether there is a monitoring band associated with recipe A at a time when recipe A is selected before the process using recipe A is started.

In step S22, when the determination unit 123 determines that there is no monitoring band associated with recipe A, the abnormality detection processing is ended. That is, the process is performed without the monitoring using the monitoring band.

In step S22, when the determination unit 123 determines that there is a monitoring band associated with recipe A, the determination unit 123 constantly monitors the state information using the monitoring band while the process using recipe A is performed (step S23).

Then, the determination unit 123 determines whether the semiconductor manufacturing apparatus is abnormal (step S24). Specifically, in a case where the state information is out of the range of the monitoring band when the determination unit 123 constantly monitors the state information using the monitoring band, the determination unit 123 determines that the semiconductor manufacturing apparatus is abnormal. Meanwhile, in a case where the state information is within the range of the monitoring band when the determination unit 123 constantly monitors the state information using the monitoring band, the determination unit 123 determines that the semiconductor manufacturing apparatus is normal. The abnormality determination by the determination unit 123 may be performed in the same cycle as the cycle in which the collection unit 112 collects the state information (e.g., every 0.1 seconds), or may be performed in a different cycle. Further, the abnormality determination may be performed when the process is ended, or may be performed when each of the subdivided steps of the recipe for performing the process is ended. The abnormality determination may be performed in a shorter cycle than a period until the process or step is ended, from the viewpoint that the abnormality of the semiconductor manufacturing apparatus may be predicted early. Further, the determination unit 123 indexes how much the state information is within the range of the monitoring band, and determines whether the semiconductor manufacturing apparatus is abnormal based on the indexed value and the reference value. Details of the abnormality determination based on the indexed value and the reference value will be described later.

In step S24, when the determination unit 123 determines that the semiconductor manufacturing apparatus is abnormal, the display unit 131 displays an alarm indicating that the semiconductor manufacturing apparatus is abnormal (step S25), and the abnormality detection processing is ended. The alarm display may be performed to display, for example, only state information that is determined to be abnormal, or may be performed to display both state information that is determined to be abnormal and state information that is determined to be normal. Further, when the determination unit 123 determines that the semiconductor manufacturing apparatus is abnormal, the control unit 111 may temporarily stop the process instead of the alarm display by the display unit 131 or in addition to the alarm display by the display unit 131. Whether to stop the process by the control unit 111 may be determined depending on, for example, the type of the state information that is determined to be abnormal.

In step S24, when the determination unit 123 determines that the semiconductor manufacturing apparatus is normal, the control unit 111 determines whether the process using recipe A is ended (step S26).

In step S26, when the control unit 111 determines that the process using recipe A is ended, the arithmetic unit 122 performs re-learning (step S27). Specifically, the arithmetic unit 122 performs re-learning to generate a new monitoring band, based on the monitoring band associated with the recipe A stored in the storage unit 121 and the log of the process that is monitored using the monitoring band and determined to be normal (step S28). Then, the abnormality detection processing is ended.

In step S26, when the control unit 111 determines that the process using recipe A is not ended, the process returns to step S23, and continues the constant monitoring of the state information using the monitoring band.

Figure 6:
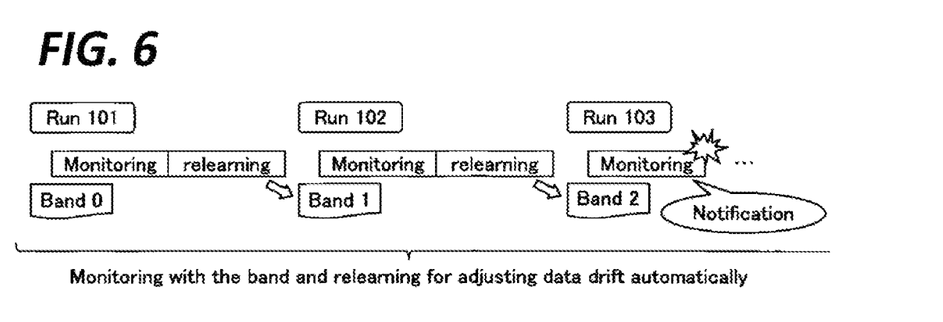
FIG. 6 is a view for explaining the re-learning.

Hereinafter, the re-learning will be described in detail. FIG. 6 is a view for explaining the re-learning.

As illustrated in FIG. 6, descriptions will be made on an exemplary case where a plurality of processes using recipe A (e.g., Run 101, Run 102, Run 103, . . . ) are performed. In FIG. 6, it is assumed that the state information when the processes "Run 101" and "Run 102" are performed is within the range of the monitoring band, and the state information when the process "Run 103" is performed is out of the range of the monitoring band.

First, the determination unit 123 constantly monitors the state information when the process "Run 101" using recipe A is performed by the monitoring band "Band 0." After the process "Run 101" is ended, the arithmetic unit 122 performs re-learning to generate a new monitoring band "Band 1" based on the monitoring band "Band 0" and the log of the state information when the process "Run 101" is performed.

Subsequently, the determination unit 123 constantly monitors the state information when the process "Run 102" using recipe A is performed by the monitoring band "Band 1." After the process "Run 102" is ended, the arithmetic unit 122 performs re-learning to generate a new monitoring band "Band 2" based on the monitoring band "Band 1" and the log of the state information when the process "Run 102" is performed.

Subsequently, the determination unit 123 constantly monitors the state information when the process "Run 103" using recipe A is performed by the monitoring band "Band 2." When a sudden abnormality that exceeds the range of the monitoring band "Band 2" occurs during the performance of the process "Run 103," the determination unit 123 determines that the semiconductor manufacturing apparatus is abnormal, without generating a new monitoring band. Then, the display unit 131 displays an alarm, which indicates that the semiconductor manufacturing apparatus is abnormal.

In this manner, the determination unit 123 constantly monitors the state information when the process using recipe A is performed. Then, when the state information is out of the range of the monitoring band, the determination unit 123 determines that the semiconductor manufacturing apparatus is abnormal. Accordingly, it is possible to detect minute changes occurring in a short period of time and predict the abnormality. As a result, the apparatus trouble may be prevented beforehand.

Further, the determination unit 123 constantly monitors the state information when the process using recipe A is performed. Then, when the state information is within the range of the monitoring band, the determination unit 123 performs re-learning to generate a new monitoring band. Therefore, it is possible to suppress erroneous detection in which the semiconductor manufacturing apparatus is determined to be abnormal when a change in state information occurs within the certain tolerable range that does not adversely affect the result of the process.

Figure 7:
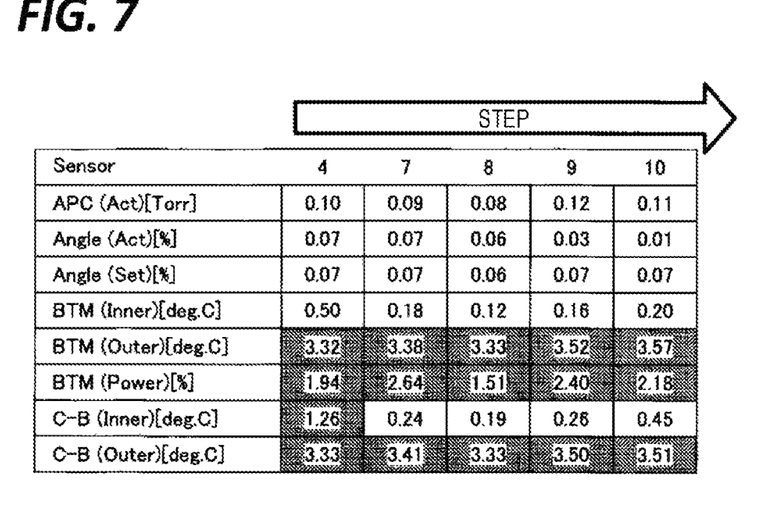
FIG. 7 is a view for explaining an exemplary abnormality determination of the semiconductor manufacturing apparatus.

Next, descriptions will be made on an exemplary abnormality determination of the semiconductor manufacturing apparatus by the determination unit 123. FIG. 7 is a view for explaining an exemplary abnormality determination of the semiconductor manufacturing apparatus. In FIG. 7, "APC (Act)" indicates a pressure of a portion at which an APC valve is provided, "Angle (Act)" indicates an actual value of the opening degree of the APC valve, and "Angle (Set)" indicates a set value of the opening degree of the APC valve. Further, "BTM (Inner)" and "BTM (Outer)" indicate temperatures at the BTM position of the inner cylinder 6 and the outer cylinder 8, respectively, that is, at the position where the heating unit 60e is provided. "BTM (Power)" indicates an electric power to be supplied to the BTM position, that is, an electric power to be supplied to the heating unit 60e. "C-B (Inner)" and "C-B (Outer)" indicate temperatures at the C-B position of the inner cylinder 6 and the outer cylinder 8, respectively, that is, at the position where the heating unit 60d is provided. In FIG. 7, for the convenience of explanation, the case where the determination is made in 45 regions including nine sensors and five steps is illustrated by way of an example. However, this is illustrative, and in an actual semiconductor manufacturing apparatus, the determination will be made in regions including more sensors and steps.

In the above-described example, the monitoring band is generated per recipe and per sensor. In the recipe, however, there is a unit of processing called a "step" obtained by subdividing the recipe. The abnormality determination using the monitoring band may also be performed in this step unit.

When the determination unit 123 constantly monitors the state information, it is indexed how much the state information is normally within the range of the monitoring band for each step. When the indexed value exceeds a reference value, it may be regarded as abnormal. Therefore, it is possible to suppress erroneous detection in which the semiconductor manufacturing apparatus is determined to be abnormal by the determination unit 123 when the state information is instantaneously out of the range of the monitoring band due to, for example, noise.

Specifically, for example, as illustrated in FIG. 7, the ratio of the state information to the upper limit value (or the lower limit value) is statistically processed to be indexed. When the indexed value is less than 1.0, it may be determined to be normal, and when the indexed value is 1.0 or more, it may be determined to be abnormal. In FIG. 7, the backgrounds of the steps and sensors that are determined to be normal are illustrated in white, and the backgrounds of the steps and sensors that are determined to be abnormal are illustrated in dots. Specifically, "BTM (Outer)," "BTM (Power)," and "C-B (Outer)" in steps "4," "7," "8," "9," and "10," and "C-B (Inner)" in step "4" are abnormal.

In this case, the determination unit 123 determines that "BTM (Outer)," "BTM (Power)," and "C-B (Outer)" in steps "4," "7," "8," "9," and "10," and "C-B (Inner)" in step "4" are abnormal. Then, the display unit 131 displays the abnormality of "BTM (Outer)," "BTM (Power)," and "C-B (Outer)" in steps "4," "7," "8," "9," and "10," and "C-B (Inner)" in step "4." Thus, for example, the operator may easily confirm the state of the semiconductor manufacturing apparatus by checking the display unit 131.

In the exemplary embodiment, the apparatus controller 100 is an example of the abnormality detection apparatus.

As described above, the apparatus controller 100 according to an aspect of the present disclosure includes the collection unit 112 that collects state information indicating a state of each part of the semiconductor manufacturing apparatus in a predetermined cycle; the storage unit 121 that stores the state information collected by the collection unit 112 as a log for each predetermined unit; the arithmetic unit 122 that generates a monitoring band for monitoring the state of each part of the semiconductor manufacturing apparatus, based on the log stored in the storage unit 121; and the determination unit 123 that determines whether the state of each part of the semiconductor manufacturing apparatus is abnormal, based on the state information and the monitoring band. Therefore, the state information may be constantly monitored when the semiconductor manufacturing apparatus performs a process. Thus, it is possible to detect minute changes occurring in a short period of time and predict abnormality. As a result, the apparatus trouble may be prevented beforehand. Further, for example, the administrator or the user of the semiconductor manufacturing apparatus may not manually set, for example, the threshold value for abnormality determination, and the monitoring period.

Further, when it is determined that the state of each part of the semiconductor manufacturing apparatus is not abnormal during the performance of the process by the semiconductor manufacturing apparatus, the arithmetic unit 122 generates a new monitoring band based on the log of the process and the monitoring band associated with the recipe used in the process. Therefore, it is possible to suppress erroneous detection in which the semiconductor manufacturing apparatus is determined to be abnormal by the determination unit 123 when the state information is instantaneously out of the range of the monitoring band due to, for example, noise.

Further, since the apparatus controller 100 according to the exemplary embodiment of the present disclosure is configured as a controller accommodated in the semiconductor manufacturing apparatus, the abnormality detection in the semiconductor manufacturing apparatus may be performed without preparing an external server.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An abnormality detection apparatus comprising:
   a collection unit that collects state information indicating a state of each part of a semiconductor manufacturing apparatus in a predetermined cycle;
   a storage unit that stores the state information collected by the collection unit as a log for each predetermined unit;
   an arithmetic unit that generates a monitoring band for monitoring the state of each part of the semiconductor manufacturing apparatus, based on the log;
   a determination unit that determines whether the state of each part of the semiconductor manufacturing apparatus is abnormal, based on the state information and the monitoring band; and
   a display unit that displays a determination result generated by the determination unit to a user,
   wherein the arithmetic unit generates a new monitoring band based on the monitoring band associated with the same recipe stored in the storage unit and the log of a process that is monitored using the monitoring band and determined to be normal.

2. The abnormality detection apparatus of claim 1, wherein after a process by the semiconductor manufacturing apparatus is completed, the determination unit determines whether there are more than a prescribed number of logs of a process performed according to the same recipe as a recipe used in the process by referring to the storage unit.

3. The abnormality detection apparatus of claim 2, wherein when the determination unit determines that there are more than the prescribed number of logs of the process performed according to the same recipe as the recipe used in the process, the monitoring band includes a monitoring band generated by being associated with the recipe using a plurality of logs stored in the storage unit.

4. The abnormality detection apparatus of claim 1, wherein when the process by the semiconductor manufacturing apparatus is started, the determination unit determines whether there is a monitoring band associated with the recipe used in the process by referring to the storage unit, and
   when there is a monitoring band associated with the recipe used in the process, the determination unit determines whether the state of each part of the semiconductor manufacturing apparatus is abnormal based on the log of the process and the monitoring band associated with the recipe used in the process.

5. The abnormality detection apparatus of claim 4, wherein when the determination unit determines that the state of each part of the semiconductor manufacturing apparatus is not abnormal, the arithmetic unit generates a new monitoring band based on the log of the process and the monitoring band associated with the recipe used in the process.

6. The abnormality detection apparatus of claim 1,
   wherein the display unit displays abnormality of the semiconductor manufacturing apparatus when the determination unit determines that the state of each part of the semiconductor manufacturing apparatus is abnormal.

7. The abnormality detection apparatus of claim 1, wherein the monitoring band is a waveform calculated by performing interpolation based on upper and lower limit values set at the predetermined cycle.

8. The abnormality detection apparatus of claim 1, wherein the predetermined unit is a recipe unit.

9. The abnormality detection apparatus of claim 1, wherein the predetermined unit is a step unit obtained by subdividing the recipe.

10. The abnormality detection apparatus of claim 1, wherein the state information is information including a temperature, a pressure, a gas flow rate, an electric power of each part of the semiconductor manufacturing apparatus.

11. An abnormality detection apparatus comprising:
    a memory; and
    a processor coupled to the memory and configured to:
    collect state information indicating a state of each part of a semiconductor manufacturing apparatus in a predetermined cycle;
    store the state information collected as a log for each predetermined unit in the memory;

generate a monitoring band for monitoring the state of each part of the semiconductor manufacturing apparatus, based on the log;

determine whether the state of each part of the semiconductor manufacturing apparatus is abnormal, based on the state information and the monitoring band; and display a determination result in a display unit, wherein the processor is further configured to generate a new monitoring band based on the monitoring band associated with the same recipe stored in the memory and the log of a process that is monitored using the monitoring band and determined to be normal.

12. The abnormality detection apparatus of claim 11, wherein the monitoring band is a waveform calculated by performing interpolation based on upper and lower limit values set at the predetermined cycle.

13. The abnormality detection apparatus of claim 11, wherein the processor displays abnormality of the semiconductor manufacturing apparatus when the processor determines that the state of each part of the semiconductor manufacturing apparatus is abnormal.

14. The abnormality detection apparatus of claim 13, wherein, after a process by the semiconductor manufacturing apparatus is completed, the processor determines whether there are more than a prescribed number of logs of a process performed according to the same recipe as a recipe used in the process by referring to the memory.

15. The abnormality detection apparatus of claim 14, wherein when the processor determines that there are more than the prescribed number of logs of the process performed according to the same recipe as the recipe used in the process, the monitoring band includes a monitoring band generated by being associated with the recipe using a plurality of logs stored in the memory.

16. The abnormality detection apparatus of claim 13, wherein when the process by the semiconductor manufacturing apparatus is started, the processor determines whether there is a monitoring band associated with the recipe used in the process by referring to the memory, and when there is a monitoring band associated with the recipe used in the process, the processor determines whether the state of each part of the semiconductor manufacturing apparatus is abnormal based on the log of the process and the monitoring band associated with the recipe used in the process.

17. The abnormality detection apparatus of claim 16, wherein when the processor determines that the state of each part of the semiconductor manufacturing apparatus is not abnormal, the processor generates a new monitoring band based on the log of the process and the monitoring band associated with the recipe used in the process.

18. The abnormality detection apparatus of claim 13, wherein the state information is information including a temperature, a pressure, a gas flow rate, an electric power of each part of the semiconductor manufacturing apparatus.

* * * * *